United States Patent
Amir

(10) Patent No.: US 10,008,364 B2
(45) Date of Patent: Jun. 26, 2018

(54) ALIGNMENT OF MULTI-BEAM PATTERNING TOOL

(71) Applicant: KLA-Tencor Corporation, Milpitas, CA (US)

(72) Inventor: Nuriel Amir, Yokne'am Ilit (IL)

(73) Assignee: KLA-Tencor Corporation, Milpitas, CA (US)

(*) Notice: Subject to any disclaimer, the term of this patent is extended or adjusted under 35 U.S.C. 154(b) by 0 days. days.

(21) Appl. No.: 14/861,502

(22) Filed: Sep. 22, 2015

(65) Prior Publication Data

US 2016/0254121 A1    Sep. 1, 2016

Related U.S. Application Data

(60) Provisional application No. 62/126,152, filed on Feb. 27, 2015.

(51) Int. Cl.
| | | |
|---|---|---|
| *H01J 37/302* | (2006.01) | |
| *G03F 9/00* | (2006.01) | |
| *H01J 37/317* | (2006.01) | |
| *H01J 37/304* | (2006.01) | |

(52) U.S. Cl.
CPC ........ *H01J 37/3026* (2013.01); *G03F 9/7019* (2013.01); *H01J 37/3045* (2013.01); *H01J 37/3177* (2013.01)

(58) Field of Classification Search
CPC ............. H01J 37/3026; H01J 37/3045; H01J 37/3177; H01J 2237/24592; H01J 2237/31774; G03F 9/7019
See application file for complete search history.

(56) References Cited

U.S. PATENT DOCUMENTS

| | | | | |
|---|---|---|---|---|
| 5,578,821 A | * | 11/1996 | Meisberger | H01J 37/28 250/310 |
| 5,939,725 A | * | 8/1999 | Muraki | B82Y 10/00 250/491.1 |
| 6,414,313 B1 | | 7/2002 | Gordon et al. | |
| 6,429,443 B1 | | 8/2002 | Mankos et al. | |

(Continued)

FOREIGN PATENT DOCUMENTS

| | | |
|---|---|---|
| JP | 2001075294 A | 3/2001 |
| JP | 2005156436 A | 6/2005 |

(Continued)

OTHER PUBLICATIONS

PCT Search Report for PCT/US2016/019727 dated Jun. 30, 2016, 3 pages.

*Primary Examiner* — Wyatt Stoffa
(74) *Attorney, Agent, or Firm* — Suiter Swantz pc llo

(57) ABSTRACT

Alignment of multi-beam pattern tools includes generating a test pattern having multiple features with a multi-beam patterning tool, acquiring an image standard associated with a test pattern standard, acquiring an image of a portion of the test pattern, comparing the portion of the image of the test pattern to the image standard to identify one or more irregularities between the portion of the image of the test pattern and the image standard, and adjusting one or more beams of the multi-beam patterning tool based on the one or more identified irregularities between the portion of the image of the test pattern and the image standard.

22 Claims, 6 Drawing Sheets

(56) References Cited

U.S. PATENT DOCUMENTS

| | | | |
|---|---|---|---|
| 6,433,348 B1 * | 8/2002 | Abboud | B82Y 10/00 250/492.22 |
| 6,617,587 B2 | 9/2003 | Parker et al. | |
| 6,667,486 B2 * | 12/2003 | Ohta | B82Y 10/00 250/396 R |
| 7,214,951 B2 | 5/2007 | Stengl et al. | |
| 7,391,033 B1 | 6/2008 | Adler | |
| 7,709,165 B2 | 5/2010 | Ekberg | |
| 7,919,218 B2 | 4/2011 | Sjostrom | |
| 8,057,972 B2 | 11/2011 | Fragner et al. | |
| 8,278,635 B2 | 10/2012 | Platzgummer et al. | |
| 8,378,320 B2 | 2/2013 | Platzgummer | |
| 8,455,838 B2 | 6/2013 | Shadman et al. | |
| 8,546,767 B2 | 10/2013 | Platzgummer et al. | |
| 8,669,523 B2 | 3/2014 | Chen et al. | |
| 8,715,909 B2 * | 5/2014 | Gutmann | G03F 1/144 430/311 |
| 8,999,627 B1 * | 4/2015 | Lam | H01J 37/3177 430/296 |
| 9,733,578 B2 * | 8/2017 | Hashimoto | G03F 7/70725 |
| 2005/0104013 A1 * | 5/2005 | Stengl | B82Y 10/00 250/492.21 |
| 2008/0043250 A1 * | 2/2008 | Fukuda | G03F 7/70275 356/614 |
| 2010/0193686 A1 * | 8/2010 | Watanabe | B82Y 10/00 250/307 |
| 2012/0293810 A1 * | 11/2012 | Meijer | B82Y 10/00 356/623 |
| 2014/0107959 A1 | 4/2014 | Kimba et al. | |
| 2015/0109601 A1 * | 4/2015 | Scheffers | H01J 37/3045 355/74 |
| 2015/0155136 A1 * | 6/2015 | Scheffers | G01B 11/14 250/206.1 |
| 2015/0261099 A1 * | 9/2015 | Yamanaka | G03F 7/70141 355/67 |

FOREIGN PATENT DOCUMENTS

| | | |
|---|---|---|
| JP | 2007292679 A | 11/2007 |
| JP | 2009182269 A | 8/2009 |

\* cited by examiner

ALIGNMENT OF MULTI-BEAM PATTERNING TOOL

CROSS-REFERENCE TO RELATED APPLICATION

The present application claims the benefit under 35 U.S.C. § 119(e) of U.S. Provisional Application Ser. No. 62/126,152, filed Feb. 27, 2015, entitled ALIGNMENT OF MULTI-BEAM PATTERNING TOOL, naming Nuriel Amir as an inventor, which is incorporated herein by reference in the entirety.

TECHNICAL FIELD

The present invention generally relates to the alignment of a multi-beam patterning tool, and, more particularly, to measuring misalignment of features formed with a multi-beam patterning tool and subsequent adjustment of the multi-beam pattern tool.

BACKGROUND

Fabricating semiconductor devices such as logic and memory devices typically includes processing a substrate, such as a semiconductor wafer, using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

As used throughout the present disclosure, the term "wafer" generally refers to substrates formed of a semiconductor or non-semiconductor material. For example, a semiconductor or non-semiconductor material may include, but is not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed. One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Electron-beam lithography, in many instances, is used to print/pattern individual device patterns or features. These patterns or features are often combined with additional device patterns or features to create a patterned semiconductor device. In addition, extreme ultraviolet (EUV) light lithography is also commonly used to print individual patterns or features of a semiconductor device.

Currently available patterning tool alignment methods are generally limited. For example, e-beam alignment typically is carried out one beam at a time, with the process being repeated over entire patterns or targets. The measurement of accuracy or inaccuracy of patterns or targets created by a single beam of a multi-beam patterning tool is time-intensive. Additionally, irregularities or inaccuracies in patterning with unaligned multi-beam systems are often cumulative because different beams may be used to print the various features of each pattern. Single-beam systems tend to increase the time of patterning, while multi-beam systems increase inaccuracy, resulting in increases in cost. Therefore, it is desirable to provide a method and system that cures the deficiencies of the prior art.

SUMMARY

A multi-beam patterning system with pattern correction capabilities is disclosed, in accordance with one embodiment of the present disclosure. In one illustrative embodiment, the system may include, but is not limited to, an imaging sub-system, the imaging sub-system having at least a detector. In another embodiment, the system may include, but is not limited to, a multi-beam patterning tool including a plurality of beams, the plurality of beams configured to produce a pattern including a plurality of features. In another embodiment, the system may include, but is not limited to, a pattern correction controller communicatively coupled to the imaging sub-system and the multi-beam patterning tool, the pattern correction controller configured to execute a set of program instructions maintained in memory, the set of program instructions configured to cause the processor to: acquire an image standard; receive image data associated with at least a portion of an image of a pattern generated by the multi-beam patterning tool; compare the image data to the image standard to identify one or more irregularities between the image data and the image standard; and adjust a beam of the multi-beam patterning tool based at least on the identified irregularity between the image data and the image standard.

A multi-beam patterning tool equipped with pattern correction capabilities is disclosed, in accordance with another embodiment of the present disclosure. In one illustrative embodiment, the tool may include, but is not limited to, at least one energy source capable of initiating and sustaining a plurality of beams. In another illustrative embodiment, the tool may include, but is not limited to, one or more optical elements. In another illustrative embodiment, the tool may include, but is not limited to, a pattern correction controller communicatively coupled to the multi-beam patterning tool, the pattern correction controller configured to execute a set of program instructions maintained in memory, the set of program instructions configured to cause the processor to: generate a pattern having a plurality of features with the plurality of beams; receive an image standard; receive image data associated with at least a portion of an image of the pattern generated; compare the image data to the image standard to identify one or more irregularities between the image data and the image standard; and adjust a beam of the plurality of beams based at least on the identified irregularity between the image data and the image standard.

A method for alignment of a multi-beam patterning tool is also disclosed. In one illustrative embodiment, the method may include, but is not limited to, generating a test pattern having a plurality of features with a multi-beam patterning tool. In another embodiment, the method may include, but is not limited to, acquiring a first image standard associated with a test pattern standard. In another embodiment, the method may include, but is not limited to, acquiring an image of the test pattern. In another embodiment, the method may include, but is not limited to, comparing at least a portion of the image of the test pattern to the first image standard to identify an irregularity between the at least a portion of the image of the test pattern and the first image standard. In another embodiment, the method may include, but is not limited to, adjusting at least a beam of the multi-beam patterning tool based at least on the identified irregularity between the at least a portion of the image of the test pattern and the first image standard.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1A:
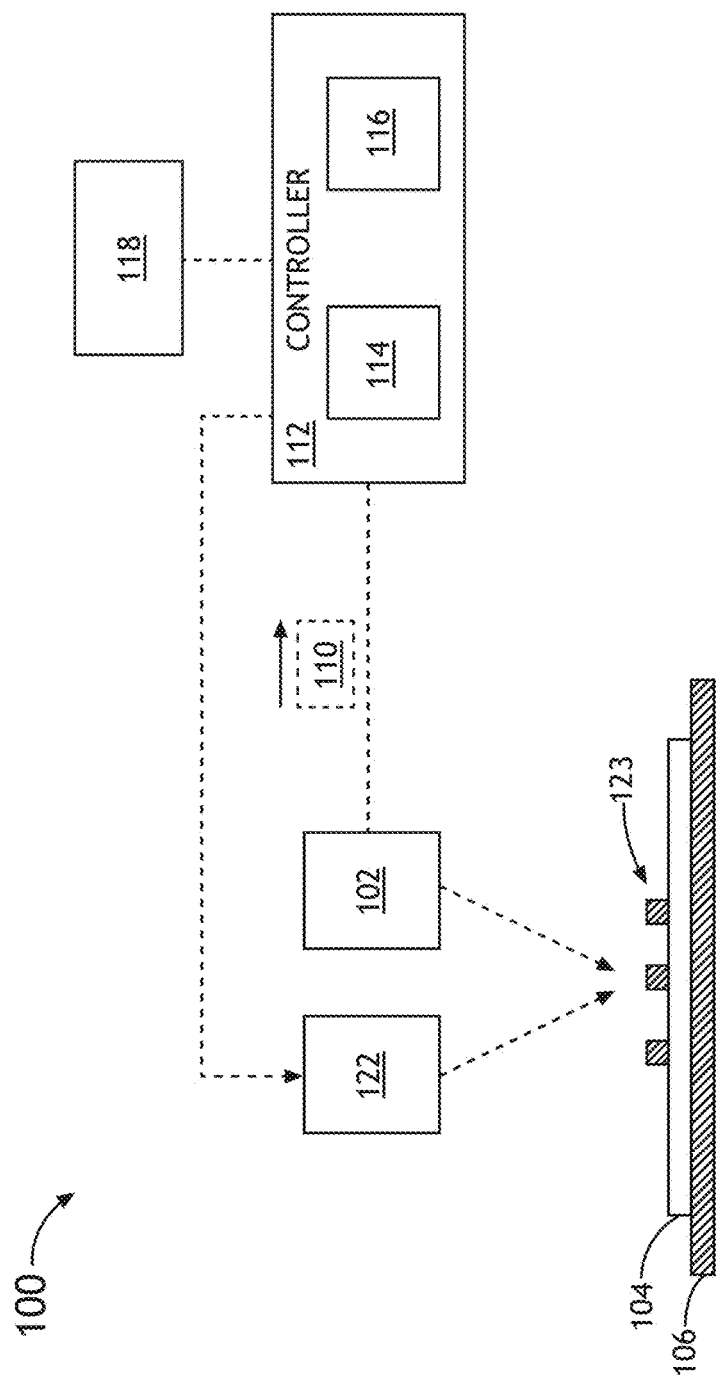
FIG. 1A shows a block diagram of a multi-beam patterning system, in accordance with one or more embodiments of this disclosure.

Reference will now be made in detail to the subject matter disclosed, which is illustrated in the accompanying drawings.

Referring generally to FIGS. 1A through 1G, systems and methods for aligning multi-beam patterning tools are described, in accordance with the present disclosure.

Embodiments of the present disclosure are directed to beam alignment within a multi-beam patterning tool, such as a lithography tool. One or more embodiments of the present disclosure may perform beam alignment through a pattern standard comparison process, which serves to identify misalignment between beams of the multi-beam patterning tool. For instance, embodiments of the present disclosure may generate a test pattern including multiple pattern features (e.g., three or more pattern features) with a multi-beam patterning tool. Additional embodiments of the present disclosure are directed to the measurement of the test pattern in order to determine misalignment between two or more pattern features of the test pattern. In this regard, one or more beams in need of corrective adjustment are identified by comparing the periodicity of the features of the pattern (e.g., three or more beams may establish a repeating pattern having an expected periodicity). In some embodiments, the multiple beams of the multi-beam patterning tool of the present disclosure are capable of printing many lines (or other ordered or periodical features) together (e.g., simultaneously or near-simultaneously). In this regard, each beam or set of beams may print a distinct feature, a portion of a feature or multiple features. It is noted herein that the patterning tool may include a large number of beams (e.g., 100-20,000 beams), which may be aligned simultaneously or in rapid succession.

Embodiments of the present disclosure are directed to the acquisition of an image of the printed feature, portion of the feature and/or multiple features. In turn, the acquired image is checked for irregularities. For example, such irregularities may include, but are not limited to, a first unaligned line. For instance, a first unaligned line may be positioned off center with respect to adjacent, but opposite second and third lines. In this regard, the first line may be positioned closer to a second line (on one side of the first line) than a third line (on the opposite side of the first line), where the lines are nominally spaced an equidistance from each other. The acquired image may be analyzed to identify irregularities in an expected periodicity of the patterned set of features. To compensate for an identified irregularity in the expected periodicity, a corrective adjustment may be applied to the beam (or beams) producing the identified irregularity. For example, the corrective adjustment may be applied to an unaligned beam producing an unaligned line, which serves to center the line associated with the unaligned beam between the second and third lines (formed by the second and third beams respectively). Performing this image analysis and alignment on a larger scale with many lines allows simultaneous irregularity identification and corrective adjustments of multiple beams very quickly.

Features, such as, but not limited to, lines or groups of lines, which display an irregular spacing (e.g., a spacing that is less than or greater than the desired spacing) may appear in an image as irregularities in the periodic or ordered pattern of the given patterned structure and may be detected through image analysis (e.g., image analysis algorithms). The detected irregularities may require one or more corrective adjustments of the patterning tool. Adjustments to the patterning tool may be provided via feedback from a pattern correction controller placed in communication with the patterning tool. After adjustment of one or more beams is performed, the newly printed features may be re-imaged or re-measured in order to ensure that satisfactory alignment was achieved. It is noted that because multiple corrective adjustments may be provided at once (i.e., corrective adjustments to multiple beams of the multi-beam tool), the number of feedback iterations may be reduced, thereby providing improved accuracy since the system does not have to account for multiple, sequential alignments, which occur in a single-beam patterning system.

Further, the simultaneous alignment of multiple beams of a multi-beam patterning tool (e.g., lithographic process tool) may serve to shorten the overall time required to generate aligned patterns. Embodiments of the present disclosure may serve to reduce or avoid error propagation resulting from a misaligned single beam, which is required to print some or all patterns of a multi-pattern structure or device. The implementation of simultaneous alignment of multiple beams results in accurate, design dense patterns or targets useful in many applications including mask making and direct write lithography.

By way of example, in the case where a given electron beam tool has 10,000 beams that produce 10,000 nominally-parallel lines (i.e., one line for each beam) on a sample, embodiments of the present disclosure may be implemented by measuring sample patterns with an imaging tool (e.g., SEM or AFM) and comparing the associated imagery data to a known synthetic image (e.g., CAD file) of perfectly aligned beams or to a real image of well aligned beams.

It is noted herein that the various embodiments of the present disclosure may be used to create patterns or features in the formation of semiconductor and non-semiconductor devices (e.g., magnetic devices).

FIG. 1A illustrates a block diagram view of a multi-beam patterning system 100 for aligning a multi-beam patterning tool. In some embodiments, the multi-beam patterning system 100 includes an imaging sub-system 102. In some embodiments, the imaging sub-system 102 is configured to perform an imaging process on a sample 104 secured by a sample stage assembly 106. In some embodiments, the multi-beam patterning system 100 includes a multi-beam patterning tool 122. In some embodiments, the multi-beam patterning tool 122 is configured to generate one or more patterns 123 on the sample 104. For example, the multi-beam patterning tool 122 may print (e.g., lithographically print) at least a portion of the given pattern onto the sample 104.

In some embodiments, the system 100 includes a pattern correction controller 112. The pattern correction controller 112 may include one or more processors 114 and memory 116 (e.g., non-transitory memory). In some embodiments, the one or more processors 114 are configured to execute a set of program instructions maintained in memory 116. The program instructions maintained in memory are configured to cause the one or more processors 114 to execute any of the steps described throughout the present disclosure.

While FIG. 1A illustrates pattern correction controller 112 as one unit in communication with both the multi-beam patterning tool 122 and the imaging sub-system 102, the present disclosure is not limited to such a configuration, which is provided merely for illustrative purposes. For example, the system 100 may include two or more controllers. For instance, the multi-beam patterning tool 122 and the imaging sub-system 102 may each have their own controller (not shown). In another instance, a first controller may be provided to generally operate and coordinate the various components of system 100, while the second controller is provided as a stand-alone pattern correction controller, dedicated to performing the corrective alignment described throughout the present disclosure. In this regard, the corrective controller may be in direct communication with the multi-beam patterning tool 122, and may be configured to image and measure a test pattern, compare the test pattern to an image standard, and generate one or more corrective alignments based on the comparison.

Referring again to FIG. 1A, in some embodiments, the pattern correction controller 112 is configured to direct the multi-beam patterning tool 122 to generate (e.g., print lithographically) a test pattern 123 having multiple features (e.g., a test pattern with a selected periodicity, or multiple features (e.g., two or more, three or more and the like) establishing a periodic pattern). In some embodiments, the pattern correction controller 112 is configured to acquire one or more image standards associated with a test pattern standard (e.g., a nominal or desired standard associated with the generated test pattern 123). In some embodiments, the pattern correction controller 112 is configured to acquire an image 110 of the test pattern 123 (e.g., image 132 of FIG. 1G). In some embodiments, the pattern correction controller 112 is configured to compare the image 110 of the test pattern 123 to the one or more image standards of the test pattern 123 to identify an irregularity between the image 110 of the test pattern 123 and the one or more image standards. In some embodiments, the pattern correction controller 112 is configured to adjust a beam of the multi-beam patterning tool 122. It is noted that the adjustment of the given beam (or beams) is based on an identified irregularity between the image 110 of the test pattern 123 and the image standard.

It is noted that the term "nominal" is interpreted as a preferred or planned pattern, structure or arrangement of features. In some embodiments, the image standard of the present disclosure may be derived from design data used to program the multi-beam pattern tool 122. In this regard, the nominal pattern may be defined by the preferred or planned pattern, structure or arrangement of features with which the multi-beam patterning tool 122 is programmed to form.

In other embodiments, an acquired image may serve as an image standard. In this regard, an acquired image 110 may be considered a nominal image standard when it is produced by a device (e.g., patterning tool) that displays a degree of deviation from a preferred or planned pattern, structure, or set of features that is within an acceptable tolerance level.

In some embodiments, as shown in FIG. 1A, the multi-beam patterning tool 122 is communicatively coupled to pattern correction controller 112. In this regard, the pattern correction controller 112 may provide feedback to the multi-beam patterning tool 122 for simultaneous communication of one or more corrective adjustments of one or more beams of the multi-beam patterning tool 122.

In some embodiments, the pattern correction controller 112 may provide feedback to the multi-beam patterning tool 122 for simultaneous communication of multiple corrective adjustments of multiple beams of the multi-beam patterning tool 122. It is noted herein that, in the case of simultaneous corrective adjustments of the multi-beam patterning tool 122, the amount of feedback necessary to maintain properly aligned beams in the multi-beam patterning tool 122 may be significantly reduced.

It is noted herein that for purposes of simplicity the imaging sub-system 102 and multi-beam patterning tool 122 have been depicted in a simplified block diagram. This depiction, including the components and geometrical configuration, is not limiting and is provided for illustrative purposes only. It is recognized herein that the imaging sub-system 102 and multi-beam patterning tool 122 may include any number of components, (e.g., illumination sources, optics, detectors, etc.) to carry out the imaging and patterning processes of the present disclosure.

It is noted that although imaging sub-system 102 and multi-beam patterning tool 122 are conceptually depicted as being in close proximity to each other, this depiction is not limiting. It is recognized herein that the imaging sub-system 102 and the multi-beam patterning tool 122 may operate in close proximity to one another or may operate remotely from one another. For example, the imaging sub-system 102 and the multi-beam patterning tool 122 may each serve as one tool/sub-system of a larger semiconductor device fabrication line. In this regard, there may (or may not) exist intervening fabrication process steps between the patterning of the features with the multi-beam patterning tool 122 and the subsequent imaging of the features with imaging sub-system 102.

Figure 1B:
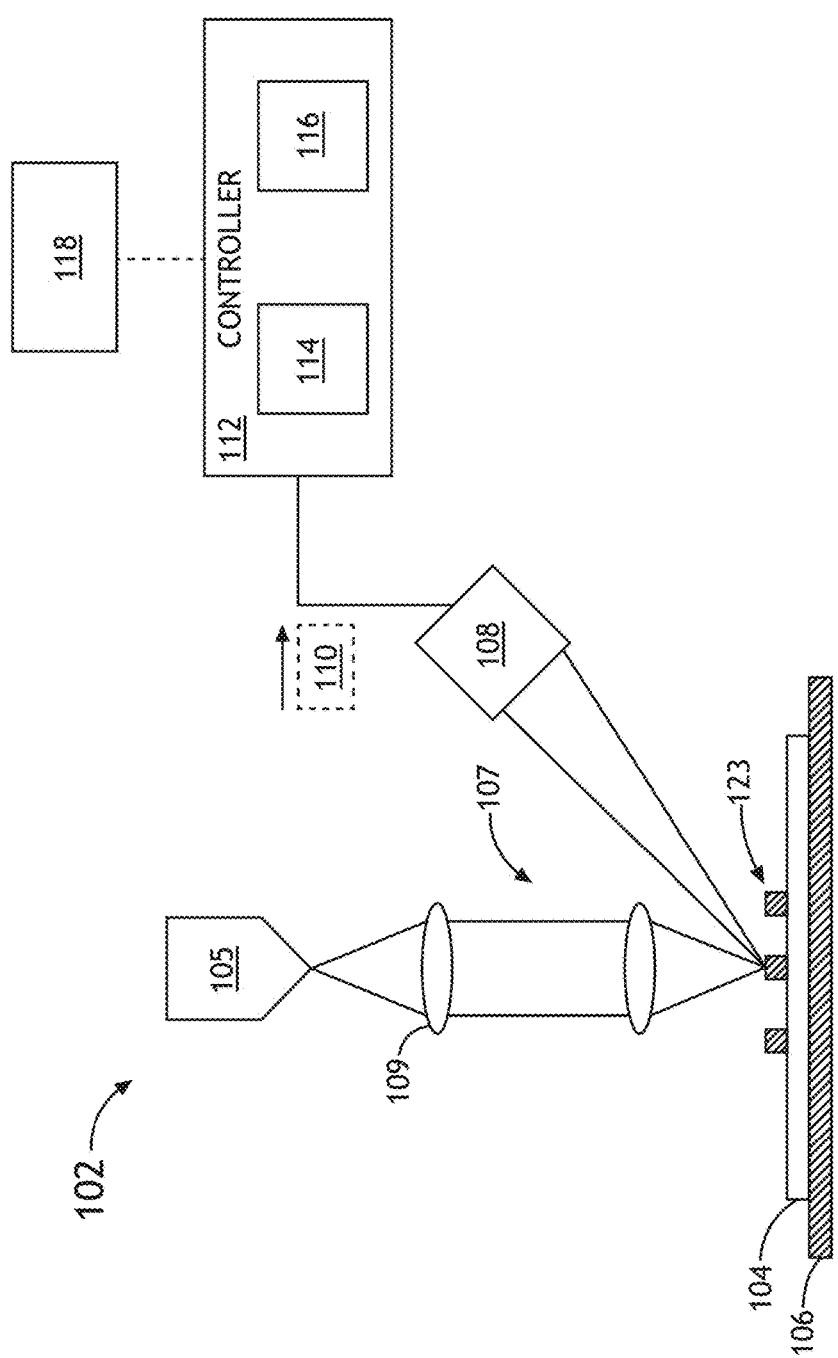
FIG. 1B shows a block diagram of an imaging subsystem, in accordance with one or more embodiments of this disclosure.

FIG. 1B illustrates a block diagram view of an imaging sub-system 102. The imaging sub-system 102 includes any imaging system known in the art of imaging and lithography. For example, the imaging sub-system 102 may include, but is not limited to, a scanning electron microscope (SEM), CD-SEM, atomic force microscope (AFM) or the like.

In some embodiments, the imaging sub-system 102 is configured to image (e.g., generate image 110) periodically repeating features (e.g., three or more features with an expected periodicity) of a pattern 123 printed onto the sample 104 (e.g., substrate, wafer or the like). In some embodiments, the imaging sub-system 102 includes one or more energy sources 105, such as but not limited to, an electron source (e.g., an electron gun). In some embodiments, the imaging sub-system 102 includes an electron-optical column 107. For example, the imaging sub-system 102 may include any number of electron-optical elements 109, such as, but not limited to, one or more electron-optical lenses. In some embodiments, the imaging sub-system 102 includes one or more detectors 108. The one or more detectors 108 include any detector known in the art of sample imaging. For example, the one or more detectors 108 may include, but are not limited to, a PMT-based detector, a backscattered electron detector, a secondary electron detector, a position-sensitive detector (PSD or PSPD), a photodiode, a differential amplifier, an x-ray detector, an energy-dispersive x-ray spectroscopy (EDS) system, a wavelength-dispersive x-ray spectroscopy (WDS) system and the like. In other embodiments, the detector 108 includes two or more detectors. Electron-beam imaging is described generally in U.S. Pat. No. 8,669,523, issued on Mar. 11, 2014, which is incorporated herein by reference in its entirety. For the purposes of the present disclosure, the imaging sub-system 102 has been generally described in the context of an electron-based source, as depicted in FIG. 1B. It is noted herein that such a configuration is not limiting and is provided merely for illustrative purposes.

Figure 1C:
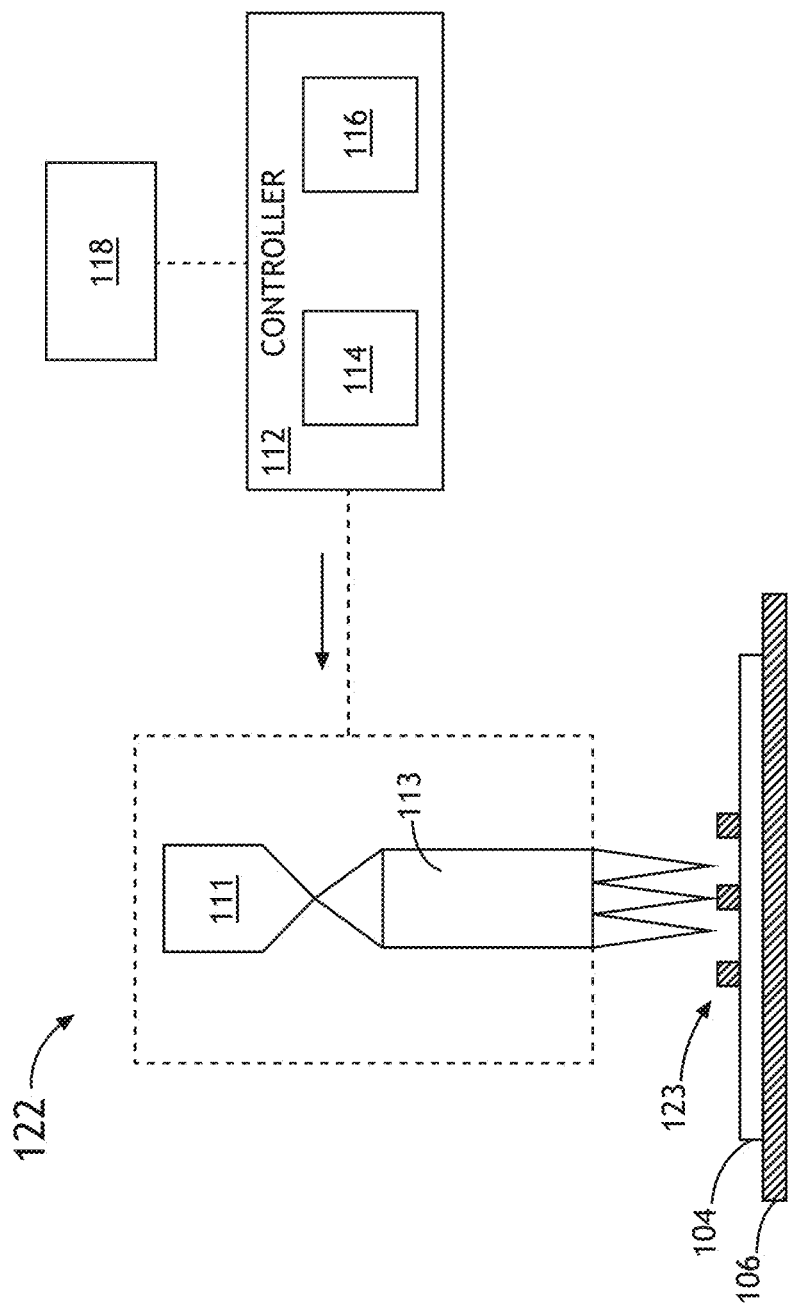
FIG. 1C shows a block diagram of a multi-beam patterning tool, in accordance with one or more embodiments of this disclosure.

FIG. 1C illustrates a block diagram view of a multi-beam patterning tool 122 suitable for generating one or more patterns 123. The multi-beam patterning tool 122 may include any lithographic printing tool known in the art. In some embodiments, the multi-beam patterning tool 122 includes one or more energy sources 111 and one or more optical elements 113. In some embodiments, the one or more energy sources 111 and/or one or more optical elements 113 are capable of initiating and sustaining a plurality of energy beams (e.g., electron beams). In other embodiments, the multi-beam patterning tool 122 includes multiple energy sources 111 and/or multiple optical elements 113 capable of initiating and sustaining a plurality of energy beams.

In some embodiments, the one or more energy sources 111 of the multi-beam patterning tool 122 include one or more electron-based energy sources. For example, the electron-based energy source may include one or more electron guns. For instance, the one or more electron guns may include one or more field emission electron guns. In other embodiments, the energy source 111 includes one or more illumination sources. For example, the one or more illumination sources may include one or more ultraviolet light sources. For instance, the one or more ultraviolet light sources may include, but are not limited to, one or more excimer lasers. In another instance, the one or more ultraviolet light sources may include, but are not limited to, one or more laser produced plasma (LPP) light sources. In another instance, the one or more ultraviolet light sources may include, but are not limited to, one or more broadband lamps (e.g., discharge lamp).

The generation of multiple beams suitable for use in a patterning tool is described generally in U.S. Pat. No. 6,429,443 to Mankos et al., filed on Jun. 6, 2000, which is incorporated herein by reference in the entirety. Multiple beam generation in a patterning tool is also generally described in U.S. Pat. No. 6,414,313 to Gordon et al., filed on Jun. 1, 1999, which is incorporated herein by reference in the entirety. Multiple beam generation in a patterning tool is also generally described in U.S. Pat. No. 8,455,838 to Shadman et al., filed on Jun. 25, 2012, which is incorporated herein by reference in the entirety. Multiple beam generation in patterning is also generally described in U.S. Pat. No. 7,391,033 to Adler, filed on Oct. 24, 2005, which is incorporated herein by reference in the entirety.

In some embodiments, the one or more optical elements 113 may include, but are not limited to, one or more electron-optical elements. For example, in electron beam (e-beam) lithography, the one or more optical elements 113 may include electron-optical elements. For instance, the one or more optical elements 113 may include, but are not limited to, one or more electron-optical lenses. In another instance, the one or more optical elements 113 may include, but are not limited to, one or more scanning coils for controlling the position of one or more of the multiple beams. In another instance, the one or more optical elements 113 may include, but are not limited to, a beam separator and an objective lens. In another instance, the one or more optical elements 113 may include, but are not limited to, an electron field lens. In another instance, the one or more optical elements 113 may include, but are not limited to magnetic components (e.g., coils, pole pieces, yokes) and electrostatic components for influencing one or more electron beams.

In some embodiments, the multi-beam patterning tool 122 includes one or more patterning elements (e.g., a programmable aperture plate system (APS) or the like). In some embodiments, the one or more patterning elements are adjustable, or include adjustable components, in order to adjust one or more beams (e.g., adjust the placement, direction, spacing and/or size of one or more beams) of the multi-beam patterning tool 122.

In other embodiments, the patterning element is positioned in an illumination path of the multi-beam patterning tool 122. For example, the one or more patterning elements may be positioned within the optical column of the multi-beam patterning tool 122. For instance, the one or more patterning elements may be positioned between the energy source 111 of the multi-beam patterning tool 122 and the sample 134. In addition, the one or more patterning elements may be communicatively coupled to controller 112.

In some embodiments, a lithography stage is configured to secure the patterning element. In this regard, the lithography stage may hold the patterning element utilizing any means known in the art, such as, but not limited to, a mechanical, vacuum, electrostatic or other chucking or clamping techniques. Further, the lithography stage may be configured to actuate or position the patterning element. For example, the lithography stage may actuate the patterning element to a selected position with respect to the one or more optical elements 113 (e.g., projection optics) of the multi-beam patterning tool 122.

It is noted herein that the multi-beam patterning tool 122 has been described in the context of electron-beam based patterning. Such configurations are not limiting and are described herein merely for illustrative purposes. For example, the multi-beam patterning tool 122 may include, but is not limited to, an ultraviolet-based lithography tool. For instance, the multi-beam patterning tool 122 may include, but is not limited to, a UV lithography tool, an EUV lithography tool or a DUV lithography tool.

In some embodiments, the plurality of beams of the multi-beam patterning tool 122 include three or more beams. In some embodiments, the three or more beams are aligned throughout multiple layers of patterning (e.g., lithographic patterning). In this regard, a feature corresponding to one of the three or more beams is defined (e.g., defined in the first layer) as an "anchor" to the other layers. This defined feature is referenced while patterning throughout multiple layers. By defining and referencing one feature as the "anchor feature," the accumulated error resulting from referencing multiple different features throughout multiple layers (any of which may be unaligned, inducing its own error impact) is reduced.

In other embodiments, one beam is defined as an "anchor beam." In this regard, if the anchor beam produces one or more aligned features, then each beam of the multi-beam patterning tool 122 is aligned with respect to the anchor beam.

In some embodiments, the multi-beam patterning tool 122 is communicatively coupled to pattern correction controller 112. In this regard, the pattern correction controller 112 may control the position of one or more beams generated by the multi-beam patterning tool 122. For example, the beam position may be controlled by controlling one or more components of the multi-beam patterning tool 122. In this regard, the pattern correction controller 112 provides corrective feedback to the multi-beam patterning tool 122 based on the imagery data 110 of patterns 123 produced by the multi-beam patterning tool 122. This corrective feedback may be converted to one or more signals for controlling one or more components of the multi-beam patterning tool 122.

In some embodiments, the pattern correction controller 112 may adjust the position of one or more beams through the control of one or more optical elements 113. For example, the pattern correction controller 112 may control the position of one or more beams by adjusting the one or more scanning coils of the multi-beam patterning tool 122.

In some embodiments, the pattern correction controller 112 may adjust the position of one or more beams through the control of a programmable aperture plate system. In other embodiments, the pattern correction controller 112 may adjust the position of one or more beams through the control of an array of vertical cavity surface emitting lasers (VCSELS).

In some embodiments, the pattern correction controller 112 may adjust the position of one or more beams through the control of one or more components of an associated illumination optical system. For example, in UV, DUV, or EUV lithography, the pattern correction controller 112 may adjust the position of one or more beams by adjusting one or more lenses and/or one or more mirrors. By way of another example, the pattern correction controller 112 may adjust the position of one or more beams through the control of one or more masks, reticles or apertures.

In some embodiments, the pattern correction controller 112 may adjust the position of one or more beams through the control of the energy source 111. For example, the pattern correction controller 112 may adjust the position of one or more beams by adjusting the position of the energy source 111.

In some embodiments, the one or more components of the multi-beam patterning tool 122 are communicatively coupled to the pattern correction controller 112 such that the pattern correction controller 112 may simultaneously adjust some or all of the beams (e.g., tens, hundreds, thousands, or more) of the multi-beam patterning tool 122 that are in need of corrective adjustment.

Applicant notes that the description of one or more components to which the pattern correction controller 112 may be communicatively coupled in order to facilitate the adjustment of one or more beams of the multi-beam patterning tool 122 is not limiting. It is noted that additional configurations and communicative coupling configurations may be used to adjust one or more beams of the multi-beam patterning tool 122.

In some embodiments, the pattern correction controller 112 may adjust the position of one or more beams through the control of a combination of two or more components of the multi-beam patterning tool 122. For example, the pattern correction controller 112 may adjust the position of one or more beams through the control of both the energy source 111 and the control of a programmable aperture plate system. By way of another example, the pattern correction controller 112 may adjust the position of one or more beams through the control of both the energy source 111 and an associated optical system. Applicant notes that additional combinations of components for adjusting the position of one or more beams are achievable, and are included in the several embodiments of this disclosure.

The embodiments of system 100 illustrated in FIGS. 1A-1C may be further configured as described herein. In addition, the system 100 may be configured to perform any other step(s) of any of the method embodiment(s) described herein. The following method embodiments relate to patterning alignment of multi-beam patterning tools. It is generally recognized that system 100 is suitable for implementing the imaging level and data processing level steps of the following embodiments. It is noted, however, the methods described below are not limited to the architecture of system 100.

Figure 1D:
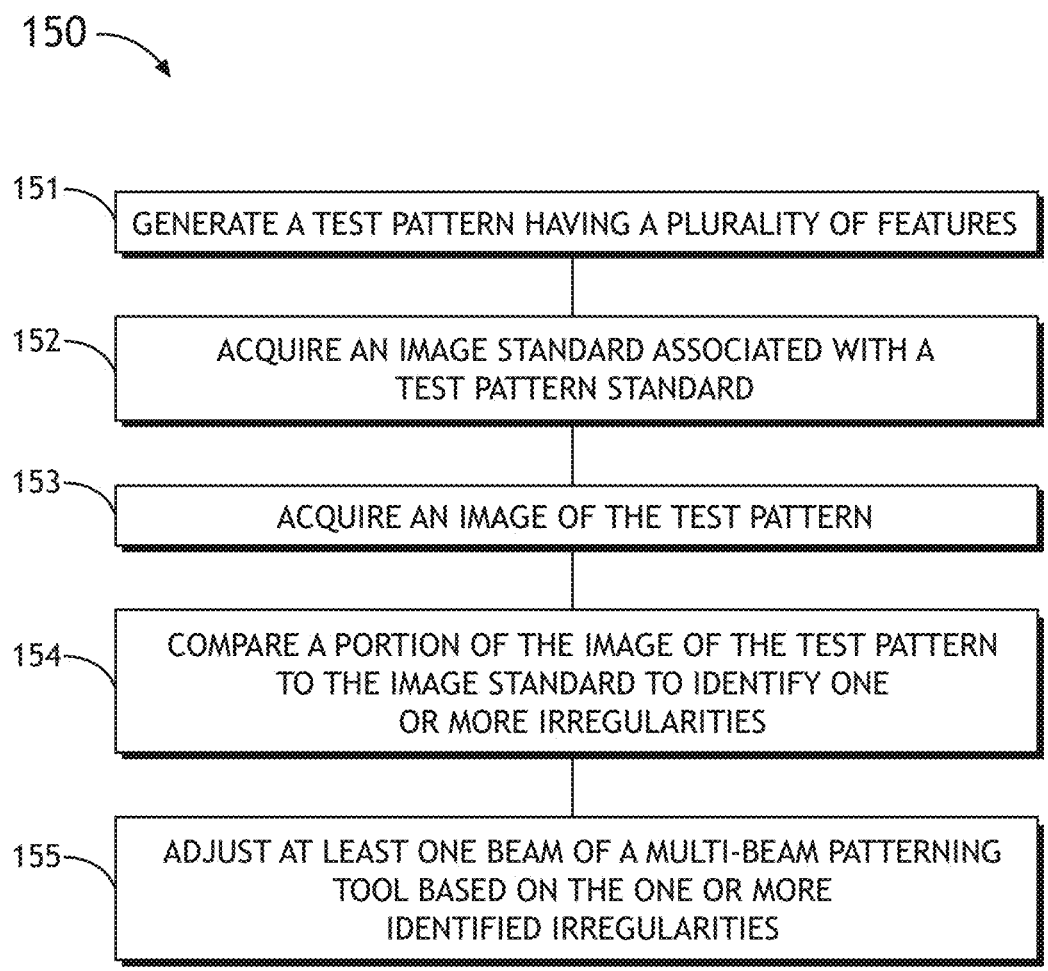
FIG. 1D shows a flow diagram depicting a method for multi-beam alignment, in accordance with one or more embodiments of this disclosure.

FIG. 1D illustrates a flow diagram depicting a multi-beam alignment process 150 for the alignment of multi-beam patterning tools, in accordance with one or more embodiments of the present disclosure.

In step 151, a test pattern, or a portion of a test pattern, is acquired or generated. For example, as shown in FIGS. 1A and 1C, the multi-beam patterning tool 122 is positioned to generate one or more test patterns 123. In some embodiments, the test pattern 123 includes a plurality of features.

Figure 1F:
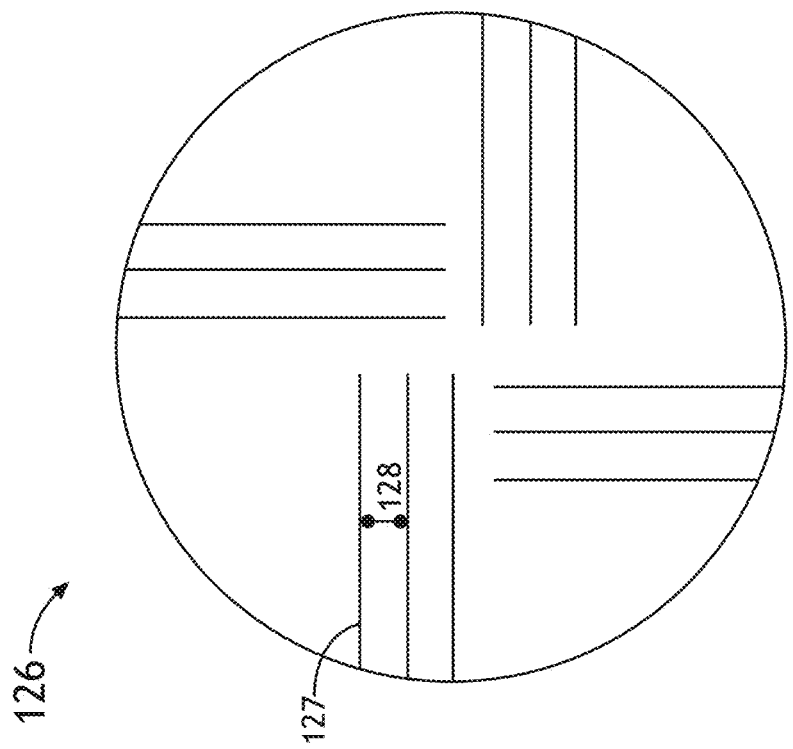
FIG. 1F shows a conceptual view of a generated test pattern and an acquired image standard, in accordance with one or more embodiments of this disclosure.
Figure 1E:
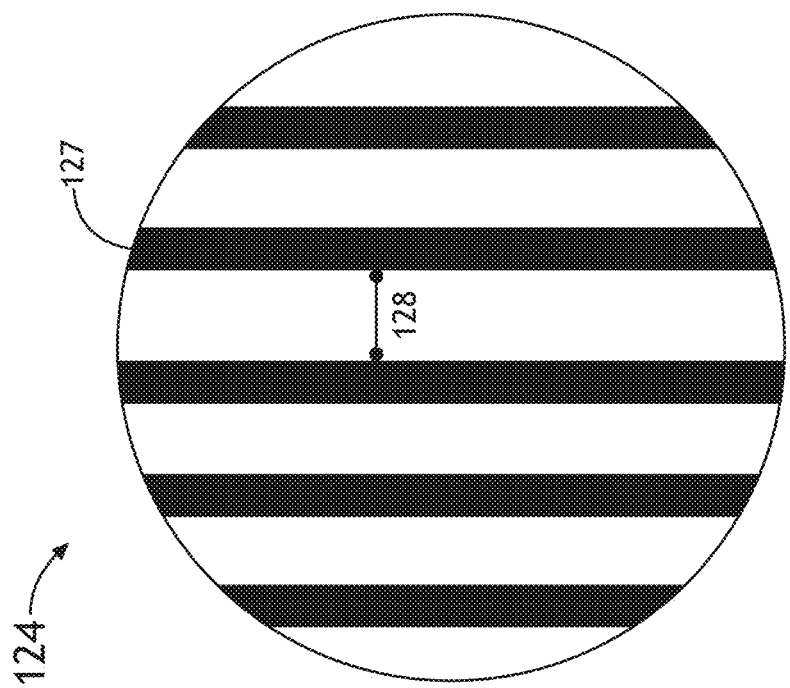
FIG. 1E shows a conceptual view of a test pattern and an acquired image standard, in accordance with one or more embodiments of this disclosure.

For example, referring to FIG. 1E, the multi-beam patterning tool 122 generates test pattern 124. It is noted that each feature 127 of the multiple features shown in test pattern 124 may include vertical, parallel features (e.g., lines separated by multiple equal distance 128). Applicant further notes that the features illustrated in test pattern 124 are provided merely for illustrative purposes and should not be interpreted as limiting on the present disclosure. It is noted that any ordered or periodic set of features is suitable for use in system 100 of the present disclosure.

By way of another example, referring to FIG. 1F, the multi-beam patterning tool 122 generates test pattern 126. Test pattern 126 shows multiples of feature 127 ordered in a vertical and a horizontal, parallel manner. Again, the use of vertical and horizontal parallel features (e.g., lines separated by equal distance 128) is not limiting. The features 127 or multiples of features may be arranged in any suitable geometrical arrangement. For instance, the features 127 may be arranged diagonally. It is further noted that the features 127 and multiples of features are not limited to lines or groups of lines. It is recognized herein that the features 127 and multiples of features may include any suitable periodic or ordered structure.

In some embodiments, the test patterns 124 and 126 include any nominal pattern having a periodic or ordered feature or features. In this sense, the test patterns 124 and 126 may be selected such that if printed properly the features of the test patterns 124 and 126 are periodic and/or ordered. Further, the pattern correction controller 112 may be programmed such that it is capable of detecting one or more irregularities within the nominal periodic and/or ordered test patterns.

Figure 1G:
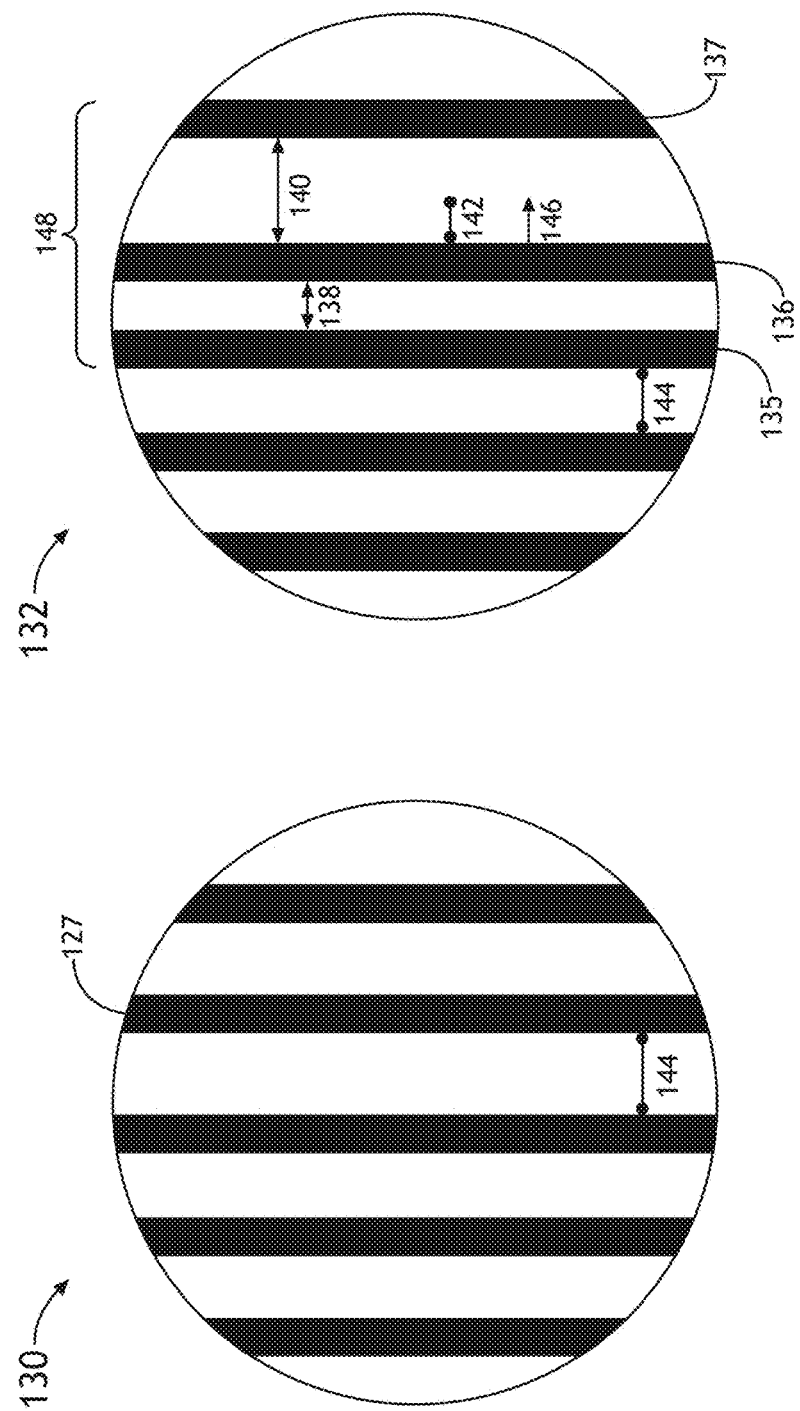
FIG. 1G shows a conceptual view of an image standard and an image of an unaligned test pattern, in accordance with one or more embodiments of this disclosure.

In step 152 a first image standard associated with a test pattern standard having an expected periodicity is acquired. Referring to FIG. 1G, the first image standard acquired is conceptualized by image standard 130. In some embodiments, image standard 130 is an image of a nominal standard. In some embodiments, image standard 130 is generated and/or calculated by design rules and/or specifications stored in one or more memories (e.g., memory 116). In some embodiments, a calculated image standard is based on a calculation that may include an average distance computation. For example, the calculated image standard may be based on the following equation:

$$P = \frac{\sum_{i=1}^{S} S_i}{N}$$

where P is the expected distance between features of a test pattern as determined by averaging a total of N spatial distances between N+1 features and S is a spatial distance between N+1 features. For instance, referring to FIGS. 1E and 1G, if pattern 130 were a calculated image standard, the variable P may be equal to spatial distance 144 of pattern 130. In this regard, a designer of the calculated image standard 130 may know that there are an expected five features 127 with a total of four spatial distances between them. Thus, if pattern 130 were a calculated image standard, then P (e.g., 144) could be found by the following:

$$P = \frac{S_1 + S_2 + S_3 + S_4}{4}$$

where $S_1$-$S_4$ correspond to the four spatial distances between features 127 shown in pattern 130, respectively.

Applicant notes that these uses are merely illustrative. In some embodiments, the image standard 130 varies depending on the multi-beam patterning tool 122 and the method employed in aligning the multi-beam patterning tool 122. For example, the image standard may include one or more feature parameters including one or more parameters expected to exist between one or more features, including, but not limited to: a spatial distance, a number of peaks or valleys in an oscillating or periodic pattern, a magnitude or amplitude of an oscillating or periodic pattern, a user provided or calculated dimension (e.g., height, width, length, etc.), an angle, a direction, a degree of curvature, or any predetermined characteristic of an image or pattern that may be used as an image standard, base, or template for a multi-beam patterning system.

In other embodiments, a feature parameter is supplied by a user using user interface 118 at step 152 to aid in subsequent steps of process 150. For example, the user may know a feature parameter (e.g., expected average distance 144 of FIG. 1G) between periodically repeating features (e.g., 127) and may supply that parameter to the pattern correction controller 112 via one or more user interfaces 118.

In some embodiments, the image standard 130 is a combination of one or more of the above-listed image standards. For example, the image standard 130 used in identifying irregularities and determining alignment corrections may include, but is not limited to, a portion that is a calculated image standard and a portion that is a nominal test pattern standard. For instance, image standard 130 may be a nominal test pattern, which is positioned to be imaged (e.g., step 152 of FIG. 1D) according to one or more calculated or user supplied feature parameters.

In some embodiments, the image standard 130 is used together with a feature parameter to provide alignment corrections to multi-beam patterning tool 122. For example, a first comparison of an image 132 (FIG. 1G) of test pattern 123 may be made (e.g., step 154 of FIG. 1D) to image standard 130 to initially align the multi-beam patterning tool 122. Then, a second comparison may be made to determine if the initial alignments to the multi-beam patterning tool 122 were correct, where the second comparison is a comparison of portions of a second image (not shown) of test pattern 123 to a feature parameter (P), as opposed to using the entire image standard 130 for the second comparison. While examples of a combination of image standards or a combination of an image standard and a feature parameter have been given, the examples given are not limiting and are merely provided for illustrative purposes.

In step 153, an image 110 of a portion of the test pattern 123 is acquired. For example, image analysis algorithms may be pre-set or programmed to recognize that if a portion of the test pattern 123 (e.g., inner portion) is aligned, then the remainder of the test pattern (e.g., outside portion or edges) is aligned. For instance, only the inner portion need be imaged. In some embodiments, an image 110 of the entire test pattern 123 is acquired. In some embodiments, the image 110 of the test pattern 123 is acquired using imaging sub-system 102. The image 110 acquired of test pattern 123 is conceptualized by image 132.

In step 154, the image 110 acquired of test pattern 123 in step 153 is compared to the image standard 130 acquired in step 152 to identify one or more irregularities between the image 110 of the test pattern 123 and the image standard 130. For example, the image 132 of test pattern 123 may be compared to image standard 130.

In some embodiments, one or more defect detection, imaging, and/or pattern recognition algorithms are used to determine whether test pattern 123 of image 132 conforms (within a selected tolerance level) to the expected periodicity associated with the image standard (e.g., the periodicity of features in image standard 130). For example, one or more defect detection, imaging, and/or pattern recognition algorithms known in the art of imaging and/or lithography may be used to determine whether test pattern 123 displays the desired or expected periodicity. For instance, defect detection algorithms may determine feature-set 148 is unaligned due to the existence of spatial irregularity 138 or spatial irregularity 140. By way of another example, one or more defect detection algorithms may determine that feature-set 148 is unaligned due to a determination that feature 136 is spatially closer to feature 135 than the desired or selected spacing. By way of another example, one or more defect detection algorithms may determine that feature-set 148 is unaligned due to a determination that feature 136 is spatially further apart from feature 137 than the desired or selected spacing.

In some embodiments, the determination of spatial irregularities occurs as one or more spatial distances (e.g., 138 and/or 140) between features of image 132 are compared to an average spatial distance (e.g., 144) found in or derived from image standard 130. For example, the distances between the features of a nominal image standard (e.g., image standard 130) may be averaged, yielding an average distance 144. The average distance 144 represents a distance expected to exist between the features (e.g., 135, 136, and/or 137) of a test pattern (e.g., image 132 of test pattern 123) as compared to the nominal pattern (e.g., image standard 130). For instance, average distance 144 may be compared to spatial distances 138 or 140, indicating if a proper distance exists between features 135, 136, and 137.

In some embodiments, the test pattern image 110 (e.g., image 132) is compared (e.g., step 154) to a combination of image standards resulting in the acquired image of the image standard (e.g., step 152). For example, a nominal image standard and a calculated image standard may be compared in step 154. In other embodiments, the test pattern image 110 (e.g., image 132) is compared to a combination of an image standard and a feature parameter (e.g., image 132 may be compared to image standard 130, where a nominal test pattern was aligned using a feature parameter in order to acquire image standard 130 in step 152).

In some embodiments, the determination of an unaligned portion of the image 132 of test pattern 123 is done by classifying one or more features into one or more featuresets. For example, referring again to FIG. 1G, in some embodiments at least two feature-sets are classified including, but not limited to, an unaligned feature-set (e.g., feature set 148) and an aligned feature-set (e.g., remaining features of image 132). In some embodiments, the classification of aligned and unaligned feature-sets reduces time required for comparing features (e.g., step 154 of FIG. 1D) of an image of a pattern (e.g., 132) to an image standard (e.g., image standard 130). For instance, only the unaligned feature-set 148 may be compared during a second comparison (e.g., a comparison after step 154 to determine if the corrective adjustments provided to the pattern correction controller 112 produced aligned features).

In step 155, after the image standard 130 has been compared to the image 132 of the test pattern 123, and one or more irregularities are identified, one or more beams of the multi-beam patterning tool 122 are adjusted based on the one or more identified irregularities between the image 132 of the test pattern 123 and the image standard 130.

For example, the pattern correction controller 112 may utilize image processing algorithms to: identify features (e.g., 135, 136, 137, etc.) of an image 110 (e.g., conceptualized in FIG. 1G as image 132), identify irregularities in the image 110 (e.g., 138 and/or 140), associate the irregularities to one or more features of the image 110 (e.g., spatial irregularity 138 and/or 140 associated with line 136), and associate the features with specific beams of the multi-beam patterning tool 122 (e.g., the beams responsible for or associated with the irregularities identified). The pattern correction controller 112 may provide signals to one or more components of the multi-beam patterning system 100 (e.g., to the multi-beam patterning tool 122, energy source 111, etc.), the signals being based on the identified irregularities. The pattern correction controller 112 may adjust one or more beams of the multi-beam patterning tool 122 based on one or more of the provided signals (e.g., the signals sent to the multi-beam patterning tool 122, energy source 111, or different components of the tool). For instance, feature 136 may be identified as being spatially too close to feature 135, or as being too far from feature 137, and one or more corrective adjustments are determined to be necessary. Accordingly, feature 136 may be moved closer to feature 137 in a direction corresponding to direction 146 and over a distance corresponding to distance 142. Again, it is noted that the use of lines as the features 135, 136, and 137 is merely illustrative, and any feature capable of contributing to an established periodicity may be used in the methods of this disclosure.

In some embodiments, three or more beams are measured at one time during steps 151 to 154. In some embodiments, after measuring the three or more beams, only one beam of the three or more beams is given a corrective adjustment. In some embodiments, after measuring three or more beams of a multi-beam patterning tool 122, each beam that is in need of corrective adjustment is adjusted based on the identified irregularities from step 154. This results in each of the beams of the multi-beam patterning tool 122 being aligned simultaneously or in rapid succession.

In some embodiments, the anchor beam will be aligned and defined based on the position of the three features (e.g., the position of three lines, with the anchor beam being centered or aligned based on the position of the two surrounding lines). In other embodiments, the anchor beam is defined before the three features are aligned. For example, a center beam may be assigned alignment coordinates, such that if the beam falls within the alignment coordinates, it may be determined to be aligned and used as a reference for any subsequent alignment of beams.

Applicant notes that the above ordering of steps should not be interpreted as limiting. It is anticipated that at least a portion of the steps of process 150 may be carried out in a different order.

In some embodiments, pattern correction controller 112 and processor 114 are configured to repeat certain steps of the multi-beam alignment process 150. After steps are repeated, the pattern correction controller 112 may provide feedback having one or more corrective adjustments (if any are determined to be necessary). If multiple corrective adjustments are provided, then the multiple corrective adjustments are communicated simultaneously or in rapid succession, and the corrective adjustments are made simultaneously or in rapid succession. If no alignment corrections are communicated, then the system 100 is determined to be in alignment and patterning continues.

In some embodiments, the processors 114 and the program instructions maintained in memory 116 are further configured to repeat steps of the methods described herein for a second, third, or Nth pattern, each pattern having a plurality of features. For example, the second pattern may have a second plurality of features (e.g., step 151). In some embodiments, the patterning correction controller 112 repeats steps including, but are not limited to, one or more of: acquiring an image of a test pattern, step 153; and comparing the image of the test pattern to a first image standard (e.g., image standard 130) to identify an irregularity between a second set of features of the image of the test pattern and the first (or a second) image standard (e.g., step 154). In some embodiments, these steps are repeated to ensure that the patterning tool remains aligned after printing multiple patterns throughout multiple layers (e.g., as in lithography). If the patterns produced at any time are determined to be unaligned, then the step of adjusting at least a beam of the multi-beam patterning tool based on an identified irregularity between the image (or portion of the image) of the test pattern and the image standard is also repeated (e.g., step 155).

In some embodiments, the one or more processors 114 of pattern correction controller 112 includes any processing elements known in the art. The one or more processors 114 includes any microprocessor-type device configured to execute algorithms and/or instructions. In some embodiments, the processor 114 includes a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. It should also be recognized that due to the complexity of the steps described throughout the disclosure, process compatibility issues may arise between old patterning systems and the multi-beam patterning system 100 contemplated in this disclosure. In general, the term "processor" may be broadly defined to encompass any device having one or more processing elements, which execute program instructions from a non-transitory memory medium 116. Moreover, different components of the system 100 (e.g., detector 108, user interface 118, or multi-beam patterning tool 122) may include a processor or logic elements suitable for carrying out at least a portion of the steps described throughout the present disclosure. Therefore, the above description should not be interpreted as a limitation on the present invention but merely an illustration.

In some embodiments, the memory 116 also includes one or more database, including, but not limited to, an image database. In some embodiments, the pattern correction controller 112 is communicatively coupled to a user interface 118. In some embodiments, the pattern correction controller 112 is communicatively coupled to imaging sub-system 102. In some embodiments, the pattern correction controller 112 is communicatively coupled to the stage assembly 106 to control actuation. In some embodiments, the pattern correction controller is communicatively coupled to processor 114 and memory 116. For example, the pattern correction controller 112 may be communicatively coupled to the imaging sub-system 102 in any suitable manner (e.g., by one or more transmission media indicated by the line shown in FIG. 1A) such that the pattern correction controller 112 can receive the output generated by the imaging sub-system 102.

In some embodiments, the system 100 includes a user interface 118, which may include any user interface known in the art. For example, the user interface 118 may include a user input device and/or a display for displaying data to a user and receiving user input instructions. For example, the user input device may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like. The display device may include any display device known in the art. In some embodiments, the display device may include, but is not limited to, a liquid crystal display (LCD). In other embodiments, the display device may include, but is not limited to, an organic light-emitting diode (OLED) based display. In other embodiments, the display device may include, but is not limited to a CRT display. In a general sense, any display device capable of integration with a user interface device (e.g., touchscreen, bezel mounted interface, keyboard, mouse, trackpad, and the like) is suitable for implementation in the present invention. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of the display device is suitable for implementation in the present invention.

Referring generally to FIGS. 1A through 1C, the memory 116 may include any storage medium known in the art suitable for storing program instructions executable by the associated one or more processors 114 and one or more database. For example, the memory 116 may include, but is not limited to, a read-only memory, a random access memory, a magnetic or optical memory device (e.g., disk), a magnetic tape, a solid state drive and the like. In some embodiments, memory 116 is configured to store one or more images from the imaging sub-system 102 (e.g., in an image database) or the output of one or more of the various steps described herein, or both. It is further noted that memory 116 may be housed in a common controller housing with the one or more processors 114. In other embodiments, the memory 116 may be located remotely with respect to the physical location of the processor 114 and pattern correction controller 112. For instance, the one or more processors 114 of pattern correction controller 112 may access a remote memory (e.g., server), accessible through a network (e.g., internet, intranet and the like) to acquire one or more images 110.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another programmed module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A multi-beam patterning system comprising:
   an imaging sub-system, the imaging sub-system having at least a detector;
   a multi-beam patterning tool including three or more beams configured to produce a pattern having a plurality of features, wherein a first beam produces a first feature of the pattern, a second beam produces a second feature of the pattern, and at least a third beam produces at least a third feature of the pattern, wherein the plurality of features have one or more feature parameters, wherein the one or more feature parameters include a selected distance between the plurality of features; and
   a pattern correction controller communicatively coupled to the imaging sub-system and the multi-beam patterning tool, the pattern correction controller configured to execute a set of program instructions maintained in memory, the set of program instructions configured to cause a processor of the pattern correction controller to:
   acquire a standard associated with a pattern produced by the multi-beam patterning tool, the standard including a nominal standard distance between the plurality of features of the pattern;
   receive image data associated with at least a portion of an image of the pattern produced by the multi-beam patterning tool, the image data including a plurality of imaged distances between the plurality of features of the pattern;
   identify one or more irregularities by comparing the nominal standard distance and the plurality of imaged distances, the plurality of imaged distances including a first imaged distance and at least a second imaged distance adjacent to the first imaged distance, the first imaged distance and the at least the second imaged distance being different than the nominal standard distance; and
   adjust one or more beams of the multi-beam patterning tool to correct the identified one or more irregularities by comparing at least one of the first imaged distance or at least the second imaged distance to the nominal standard distance.

2. The patterning system of claim 1, wherein the three or more beams of the multi-beam patterning tool include at least one anchor beam, wherein a position of at least some of the remainder of the three or more beams are aligned relative to a position of the at least one anchor beam while the pattern is produced by the multi-beam patterning tool.

3. The patterning system of claim 1, wherein the pattern correction controller is configured to acquire the standard based on an averaging process.

4. The patterning system of claim 1, wherein the pattern correction controller is configured to adjust at least three beams at a time of the multi-beam patterning tool.

5. The patterning system of claim 1, wherein the pattern correction controller is configured to simultaneously adjust two or more of the plurality of beams of the multi-beam patterning tool.

6. The patterning system of claim 1, wherein the imaging sub-system includes at least one of a scanning electron microscope (SEM), a critical dimension scanning electron microscope (CD-SEM), or an atomic force microscope (AFM).

7. The patterning system of claim 1, wherein the multi-beam patterning tool includes an electron-based patterning tool.

8. The patterning system of claim 1, wherein the multi-beam patterning tool includes an ultraviolet-based lithography tool, including at least one of an ultraviolet light (UV) lithography tool, an extreme ultraviolet light (EUV) lithography tool, or a deep ultraviolet light (DUV) lithography tool.

9. The patterning system of claim 1, wherein the three or more beams of the multi-beam patterning tool include at least one anchor beam, wherein a position of at least one feature of the plurality of features generated by the remainder of the three or more beams is aligned relative to a position of at least one feature of the plurality of features generated by the at least one anchor beam.

10. A multi-beam patterning tool for simultaneous alignment of multiple beams comprising:
    at least one energy source capable of initiating and sustaining three or more beams;

one or more optical elements; and a pattern correction controller communicatively coupled to the multi-beam patterning tool, the pattern correction controller configured to execute a set of program instructions maintained in memory, the set of program instructions configured to cause a processor of the pattern correction controller to:

generate a pattern having a plurality of features with the three or more beams, wherein a first beam produces a first feature of the pattern, a second beam produces a second feature of the pattern, and at least a third beam produces at least a third feature of the pattern, wherein the plurality of features have one or more feature parameters, wherein the one or more feature parameters include a selected distance between the plurality of features;

receive a standard associated with the generated pattern, the standard including a nominal standard distance between the plurality of features of the pattern;

receive image data associated with at least a portion of the generated pattern, the image data including a plurality of imaged distances between the plurality of features of the pattern;

identify one or more irregularities by comparing the nominal standard distance and the plurality of imaged distances, the plurality of imaged distances including a first imaged distance and at least a second imaged distance adjacent to the first imaged distance, the first imaged distance and the at least the second imaged distance between different than the nominal standard distance; and adjust one or more beams of the three or more beams to correct the identified one or more irregularities by comparing at least one of the first imaged distance or the at least the second imaged distance to the nominal standard distance.

11. The patterning tool of claim 10, further comprising:
a patterning element, wherein one or more beams of the three or more beams are adjusted by adjusting the patterning element based on the identified one or more irregularities between the nominal standard distance and the one or more imaged distances.

12. The patterning tool of claim 10, wherein the pattern correction controller is configured to acquire the standard based on an averaging process.

13. The patterning tool of claim 10, wherein the at least one energy source comprises:
one or more electron sources.

14. The patterning tool of claim 10, wherein the at least one energy source comprises:
one or more light sources.

15. The patterning tool of claim 14, wherein the one or more light sources comprise:
at least one of one or more UV light sources, one or more DUV light sources or one or more EUV light sources.

16. The patterning tool of claim 10, wherein the three or more beams include at least one anchor beam, wherein a position of at least some of the remainder of the three or more beams are aligned relative to a position of the at least one anchor beam.

17. The patterning tool of claim 10, wherein the three or more beams include at least one anchor beam, wherein a position of at least one feature of the plurality of features generated by the remainder of the three or more beams is aligned relative to a position of at least one feature of the plurality of features generated by the at least one anchor beam.

18. A method for alignment of a multi-beam patterning tool comprising:

generating a test pattern having a plurality of features with a multi-beam patterning tool, the multi-beam patterning tool having three or more beams, wherein a first beam produces a first feature of the test pattern, a second beam produces a second feature of the test pattern, and at least a third beam produces at least a third feature of the test pattern, wherein the plurality of features have one or more feature parameters, wherein the one or more feature parameters include a selected distance between the plurality of features;

acquiring a first standard associated with the test pattern, the first standard including a first nominal standard distance between the plurality of features of the test pattern;

acquiring an image of the test pattern, the image of the test pattern including a plurality of imaged distances between the plurality of features of the test pattern;

identifying one or more irregularities by comparing the first nominal standard distance and the plurality of imaged distances, the plurality of imaged distances including a first imaged distance and at least a second imaged distance adjacent to the first imaged distance, the first imaged distance and the at least the second imaged distance being different than the nominal standard distance; and adjusting one or more beams of the three or more beams of the multi-beam patterning tool to correct the identified one or more irregularities by comparing at least one of the first imaged distance or the at least the second imaged distance to the nominal standard distance.

19. The method of claim 18, wherein the plurality of features of the test pattern are nominally periodic.

20. The method of claim 18, further comprising:
generating at least a second test pattern having a plurality of features with the multi-beam patterning tool, the multi-beam patterning tool having three or more beams, wherein a first beam produces a first feature of the at least the second test pattern, a second beam produces a second feature of the at least the second test pattern, and at least a third beam produces at least a third feature of the at least the second test pattern, wherein the plurality of features have one or more feature parameters, wherein the one or more feature parameters include a selected distance between the plurality of features;

acquiring at least a second standard associated with the at least the second test pattern, the at least the second standard including at least a second nominal standard distance between the plurality of features of the at least the second test pattern;

acquiring an image of the at least the second test pattern, the image of the at least the second test pattern including a plurality of imaged distances between the plurality of features of the at least the second test pattern;

identifying one or more irregularities by comparing the plurality of imaged distances of the at least the second test pattern and the first nominal standard distance of the first standard or the at least the second nominal standard distance of the at least the second standard, the plurality of imaged distances including a third imaged distance and at least a fourth imaged distance adjacent to the third imaged distance, the third imaged distance and the at least the fourth imaged distance being different than the first nominal standard distance of the at least the second nominal standard distance; and adjusting one or more beams of the three or more beams of the multi-beam patterning tool to correct the identified one or more irregularities by comparing at least one of the third imaged distance or the at least the fourth imaged distance to the first nominal standard distance or the at least the second nominal standard distance.

21. The method of claim 18, further comprising:

defining one of the three or more beams of the multi-beam patterning tool as an anchor beam, wherein a position of at least some of the remainder of the three or more beams are aligned relative to a position of the at least one anchor beam while the test pattern is produced by the multi-beam patterning tool.

22. The method of claim 18, further comprising:

defining one of the three or more beams of the multi-beam patterning tool as an anchor beam, wherein a position of at least one feature of the plurality of features generated by the remainder of the three or more beams is aligned relative to a position of at least one feature of the plurality of features generated by the at least one anchor beam while the test pattern is produced by the multi-beam patterning tool.

* * * * *